(12) United States Patent
Bhatia

(10) Patent No.: US 7,570,537 B2
(45) Date of Patent: Aug. 4, 2009

(54) MEMORY CELLS WITH POWER SWITCH CIRCUIT FOR IMPROVED LOW VOLTAGE OPERATION

(75) Inventor: Ajay Bhatia, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/777,074

(22) Filed: Jul. 12, 2007

(65) Prior Publication Data

US 2009/0016138 A1    Jan. 15, 2009

(51) Int. Cl.
G11C 5/14    (2006.01)

(52) U.S. Cl. .................. 365/226; 365/228; 365/154

(58) Field of Classification Search ............. 365/226, 365/228, 154
See application file for complete search history.

(56) References Cited

U.S. PATENT DOCUMENTS

| | | | | |
|---|---|---|---|---|
| 4,984,204 | A | * | 1/1991 | Sato et al. ............ 365/189.11 |
| 5,018,102 | A | * | 5/1991 | Houston ..................... 365/95 |
| 5,396,469 | A | | 3/1995 | Kushiyama |
| 5,621,693 | A | * | 4/1997 | Nakase ...................... 365/227 |
| 5,646,885 | A | * | 7/1997 | Matsuo et al. ......... 365/185.05 |
| 5,848,618 | A | * | 12/1998 | Guest ........................ 138/121 |
| 5,883,838 | A | * | 3/1999 | McClure ................. 365/189.05 |
| RE37,176 | E | * | 5/2001 | Kajigaya et al. ............ 365/203 |
| 6,940,315 | B2 | * | 9/2005 | Wang et al. .................... 327/52 |
| 7,307,899 | B2 | * | 12/2007 | Khellah et al. .......... 365/189.11 |
| 7,327,630 | B2 | * | 2/2008 | Park ............................ 365/226 |
| 7,391,633 | B2 | * | 6/2008 | Dudeck et al. ............. 365/49.1 |
| 7,411,860 | B2 | * | 8/2008 | Nii ........................ 365/230.05 |
| 7,420,835 | B2 | * | 9/2008 | Wang et al. ................. 365/154 |
| 2004/0076065 | A1 | | 4/2004 | Jeung |
| 2006/0239057 | A1 | | 10/2006 | Muller et al. |
| 2007/0081407 | A1 | | 4/2007 | Maki et al. |

FOREIGN PATENT DOCUMENTS

EP        0 642 131 A2     3/1995
JP      410228778 A  *  8/1998

OTHER PUBLICATIONS

International Search Report, dated Oct. 13, 2008, 3 pages.

* cited by examiner

Primary Examiner—Viet Q Nguyen
(74) Attorney, Agent, or Firm—Osha • Liang LLP

(57) ABSTRACT

Static random access memory (SRAM) cells and methods of operation are provided which may be used to provide improved writeability and stability to support low voltage operation of memory devices. For example, in one implementation, by temporarily interrupting the connection between portions of an SRAM cell and a power source such as a reference voltage or current source, the writeability of SRAM cells can be improved. Additional read port implementations are also provided to facilitate low voltage operation. In another implementation, a power switch circuit responsive to a word line and logic signals may be used to provide such interruptions.

25 Claims, 9 Drawing Sheets

MEMORY CELLS WITH POWER SWITCH CIRCUIT FOR IMPROVED LOW VOLTAGE OPERATION

BACKGROUND

As is well known, arrays of static random access memory (SRAM) cells can be used to maintain logic states corresponding to associated data values. Individual SRAM cells may be implemented, for example, using cross-coupled logic gates. It is desirable for SRAM cells to hold their stored logic states despite possible changes in voltage, temperature, or other operating conditions. It is also desirable for SRAM cells to permit changes in their logic states in response to write operations.

Unfortunately, existing SRAM cell designs often fail to provide high degrees of both stability and writeability. For example, as operating voltages of SRAM cells are reduced, their writeability can suffer. In particular, it may be difficult for write drivers and their associated SRAM cell access transistors to pull down nodes of SRAM cells in order to satisfactorily write logic low values into the SRAM cells, while working against pull up devices of the SRAM cells. As operating voltages of the SRAM cells approach the threshold voltages of the access transistors, this write problem worsens due to gate overdrive of the access transistors. Such overdrive conditions may occur, for example, when the power provided to the access transistor gates (e.g., from word lines of a memory device) exceeds that of the power supply of the SRAM cell.

In the well known six transistor design for an SRAM cell, write operations are accomplished by discharging a precharged bitline. Writeability is generally limited by the ratio of PMOS load transistors and NMOS access transistors of the SRAM cells. In order to perform satisfactory write operations, this ratio should be selected to permit nodes of the SRAM cells to be pulled down below a trip voltage of the SRAM cells. However, at lower temperatures, the threshold voltages of the NMOS access transistors can increase which may prevent them from turning on during such conditions, resulting in write failures.

Additionally, as SRAM cell operating voltages are reduced, readability can suffer. In this case, the internal nodes of the SRAM cells may be subject to read disturbance. For example, during read operations, the internal SRAM nodes may be inadvertently charged through the access transistors above a trip voltage of the SRAM cell, thereby causing the SRAM cell to switch logic states.

In order to minimize read disturbance and improve the static noise margin (SNM), it is generally preferable to reduce the size of NMOS access transistors. However, for writeability, it is generally desirable to increase the size of such access transistors. These competing design considerations can result in SRAM cells that suffer in readability or writeability, especially in low voltage designs.

SUMMARY

Various SRAM cells disclosed herein may be used to support low voltage operation of memory devices. In one example, a memory device includes a word line and an SRAM cell. The SRAM cell includes first and second cross-coupled logic gates adapted to maintain voltages at a first node and a second node. The voltages of the first and second nodes correspond to a logic state stored by the first and second cross-coupled logic gates. The SRAM cell also includes a power switch circuit. The power switch circuit includes a first switch connected with a power source and the first cross-coupled logic gate. The first switch is adapted to selectively connect the power source with the first cross-coupled logic gate in response to a first logic signal. The power switch circuit also includes a second switch connected with the power source and the second cross-coupled logic gate. The second switch is adapted to selectively connect the power source with the second cross-coupled logic gate in response to a second logic signal. Additional switches as well as various read ports and write ports may be provided in various embodiments also disclosed herein.

These and other features and advantages of the invention will be more readily apparent from the detailed description of the embodiments set forth below taken in conjunction with the accompanying drawings.

DETAILED DESCRIPTION

In accordance with various embodiments described herein, SRAM cells may be implemented in a manner to provide a high degree of writeability and stability when operated at low voltages. Because the operating voltages of SRAM cells may determine the minimum voltages at which larger integrated circuits may be operated, the use of low voltage SRAM cells in accordance with various embodiments disclosed herein can facilitate the operation of integrated circuits at low voltages and therefore with reduced power consumption. For example, in one embodiment, various SRAM cells disclosed herein may be operated using a reference voltage of approximately 0.3V. As a result, SRAM cells in accordance with various embodiments described herein may consume less power than various prior SRAM cell designs.

In one embodiment, a memory device may be implemented with an SRAM cell having a power switch circuit configured to selectively connect a power source with cross-coupled logic gates of the SRAM cell. By selectively powering individual cross-coupled logic gates in response to various logic signals during write operations, nodes of the SRAM cell corresponding to stored logical states may be successfully pulled down, even when the SRAM cell is operated at low voltages.

By temporarily interrupting the connection between portions of an SRAM cell and a power source such as a reference voltage or current source, the writeability of SRAM cells can be improved. In particular, by selectively interrupting this connection on a cell-by-cell basis, the writeability of individual SRAM cells may be improved without compromising the stability of other SRAM cells in a shared row or column of an SRAM cell array of a memory device. Such SRAM cells may also be implemented using bidirectional read/write ports, one or more single ended read ports, or one or more differential read ports to facilitate low voltage operation.

Such power switch circuits may also be configured to power both cross-coupled logic gates of SRAM cells during read operations. As a result, the SRAM cells may retain their stored logical states when access transistors are turned on during read operations.

Advantageously, various SRAM cell configurations disclosed herein can exhibit acceptable writeability and stability despite process variations (e.g., irregularities in SRAM cell transistor sizes) or power or voltage fluctuations (e.g., static IR drops corresponding to static voltage changes caused by changes in current or resistance attributable to temperature variations or other factors), thereby improving the overall yield of manufactured SRAM cells used in low power applications. In this regard, the SRAM cell may be operated over a greater range of voltages than various prior designs in order to compensate for differences in the threshold voltages of SRAM cell transistors and the trip voltages of SRAM cells.

Figure 1:
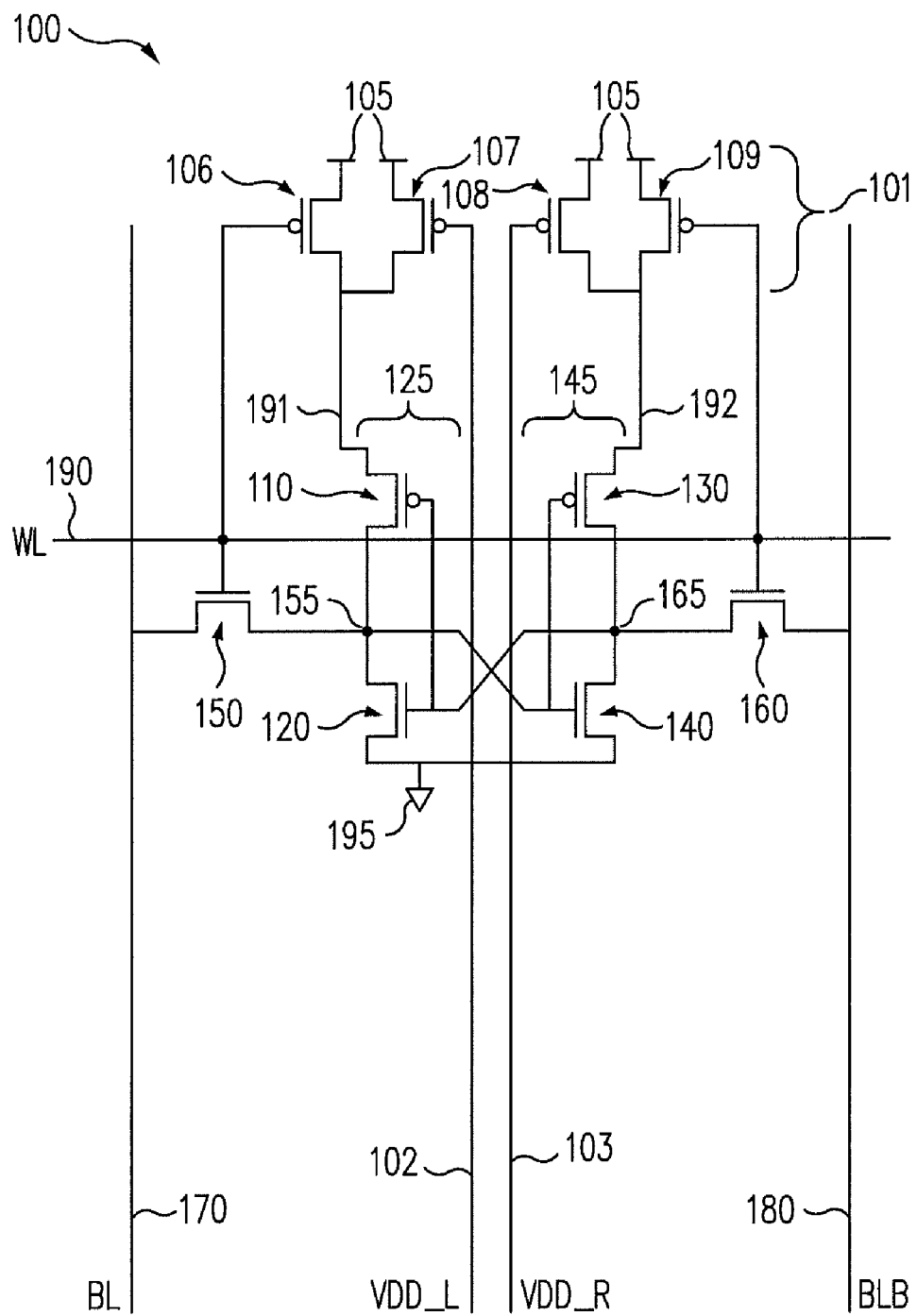
FIGS. 1-8 illustrate a plurality of circuits which may be used to implement various SRAM cells in accordance with embodiments of the invention.

Referring now to the drawings wherein the showings are for purposes of illustrating embodiments of the invention only, and not for purposes of limiting the same, FIG. 1 illustrates a circuit 100 which may be used to implement an SRAM cell in accordance with an embodiment of the invention. As shown in FIG. 1, circuit 100 includes a pair of cross-coupled inverters 125 and 145 implemented by transistors 110/120 and 130/140, respectively. Transistors 110 and 130 are connected with a power switch circuit 101 through power supply lines 191 and 192, respectively, and transistors 120 and 140 are connected with a reference voltage 195. In some embodiments, reference voltage 195 corresponds, for example, to ground.

Power switch circuit 101 includes transistors 106, 107, 108, and 109, each of which are connected with a reference voltage 105 which may correspond, for example, to a power supply voltage. Reference voltage 105 may alternatively be implemented as a current source or other appropriate power source. The gates of transistors 106 and 109 are connected with a word line 190. Accordingly, word line 190 may be used to selectively turn on or turn off transistors 106 and 109 of power switch circuit 101.

The gates of transistors 107 and 108 are connected with power control lines 102 and 103, respectively. In this regard, power control lines 102 and 103 may be used to selectively turn on or turn off transistors 107 and 108 of power switch circuit 101. Power control lines 102 and 103 are connected with appropriate logic circuitry for providing appropriate logic high and logic low signals. In one embodiment, the logic values of power control lines 102 and 103 may correspond to logic states to be written into the SRAM cell of FIG. 1. In another embodiment, power control lines 102 and 103 are implemented by logic circuitry that performs a logic AND operation on a write data signal, a write enable signal, and a column select signal of a memory device including circuit 100.

Access transistors 150 and 160 are connected with word line 190 as well as bit lines 170 and 180 (also referred to as data lines), and nodes 155 and 165, respectively. Accordingly, word line 190 is used to selectively connect bit lines 170 and 180 with nodes 155 and 165 through access transistors 150 and 160, respectively.

While circuit 100 is storing a given logic state, power switch circuit 101 may operate in a state that maintains the voltage of each of power supply lines 191 and 192 approximately equal to reference voltage 105. In this state, each of power control lines 102 and 103 may be set to logic low voltages. As a result, each of transistors 107 and 108 remain turned on to provide power through power supply lines 191 and 192 to transistors 110/120 and 130/140, respectively.

For example, if circuit 100 is storing a first logic state (e.g., corresponding to a data value of 0), node 155 may be set to a logic low voltage while node 165 is set to a logic high voltage. Accordingly, transistors 120 and 130 will be turned on, and transistors 110 and 140 will be turned off. In this case, because the voltage of power supply line 192 is approximately equal to reference voltage 105, transistor 130 will operate to pull up the voltage of node 165 to maintain the first logic state.

Similarly, if circuit 100 is storing a second logic state (e.g., corresponding to a data value of 1), node 165 will be set to a logic low voltage while node 155 is set to a logic high voltage. Accordingly, transistors 110 and 140 will be turned on, and transistors 120 and 130 will be turned off. In this second case, because the voltage of power supply line 191 is also approximately equal to reference voltage 105, transistor 110 will operate to pull up the voltage of node 155 to maintain the second logic state.

Power switch circuit 101 may continue to maintain the voltage of each of power supply lines 191 and 192 approximately equal to reference voltage 105 during read operations. For example, during a read operation, word line 190 may be set to a logic high voltage. As a result, access transistors 150 and 160 will be turned on and transistors 106 and 109 will be turned off. However, power control lines 102 and 103 will each remain set to logic low voltages during the read operation, thereby keeping transistors 107 and 108 turned on to continue providing power through power supply lines 191 and 192 to transistors 110/120 and 130/140, respectively. Bit lines 170 and 180 may be precharged and inverters 125 and 145 may operate to drive bit lines 170 and 180 with appropriate voltages corresponding to the logic state stored by circuit 100.

During a write operation to switch circuit 100 from a first logic state to a second logic state, power switch circuit 101 may interrupt the power supplied through power supply line 192 while continuing to maintain the voltage of power supply line 192 approximately equal to reference voltage 105. In this example, nodes 155 and 165 will be initially set to logic low and high voltages, respectively, transistors 120 and 130 will be turned on, and transistors 110 and 140 will be turned off while circuit 100 is initially storing the first logic state.

During this write operation, bit lines 170 and 180 are driven high and low, respectively, by appropriate write circuitry, and power control lines 102 and 103 are driven low and high, respectively, by appropriate logic circuitry. Word line 190 is also driven high which causes access transistors 150 and 160 to turn on, and further causes transistors 106 and 109 of power switch circuit 101 to turn off.

Accordingly, bit line 180 will operate to pull node 165 down from a logic high voltage to a logic low voltage. Because both of transistors 108 and 109 are turned off (by power control line 103 and word line 190, respectively), power supplied through power supply line 192 will be interrupted. As a result, bit line 180 may easily overcome transistor 130 and pull down node 165.

When node 165 is pulled below the threshold voltage of transistor 110, transistor 110 will be turned on and operate to pull up the voltage of node 155. Although transistors 106, 108, and 109 will be turned off by power control line 103 and word line 190, remaining transistor 107 will remain turned on due to the low logic voltage of power control line 102. As a result, transistor 107 will continue to operate during the write operation to maintain the voltage of power supply line 191 approximately equal to reference voltage 105 and therefore pull up the voltage of node 155 to correspond to the newly written second logic state.

During a second write operation to switch circuit 100 from the second logic state to the first logic state, power control circuit 101 may interrupt the power supplied through power supply line 191. In this regard, power control lines 102 and 103 will be driven high and low, respectively while word line 190 is also driven high. Also in this case, bit lines 170 and 180 will be driven low and high, respectively.

As a result, transistors 106, 107, and 109 will be turned off by power control line 102 and word line 190, and remaining transistor 108 will remain turned on due to the low logic voltage of power control line 103. Accordingly, bit line 170 will easily overcome transistor 110 and pull down node 155. By maintaining the voltage of power supply line 192 approximately equal to reference voltage 105 during this second write operation, transistor 130 will operate with sufficient current to pull up the voltage of node 165 in order to change circuit 100 back to the first logic state.

Advantageously, by selectively interrupting the power provided to power supply line 191 or 192 during write operations, desired logic states may be more easily written into the SRAM cell of circuit 100 when implemented with low operating voltages. In addition, circuit 100 may be implemented in a plurality of SRAM cells of a memory device without the individual SRAM cells disturbing each other. For example, power control lines 102 and 103 may be shared by a column of SRAM cells in an SRAM cell array implemented by a plurality of circuits 100. Because of this shared implementation, either transistor 107 or 108 of all SRAM cells in a column will be switched off during write operations performed on any one of the rows of SRAM cell array. However, during a write operation performed on one row, the word lines 190 associated with the remaining rows of the SRAM cell array will be set to logic low voltages. As a result, transistors 106 and 109 of the non-writing rows will remain turned on, while transistors 106 and 109 of the currently written row will be turned off. For those rows that are not currently being written, transistors 106 and 109 may operate to power transistors 110/120 and 130/140. Accordingly, power may be selectively interrupted to individual cross-coupled logic gates of particular SRAM cells of a selected row, without disturbing the power supplied to SRAM cells of other rows (e.g., SRAM cells sharing columns with the selected row), thereby improving the retention of logic states by SRAM cells of the other rows.

Figure 2:
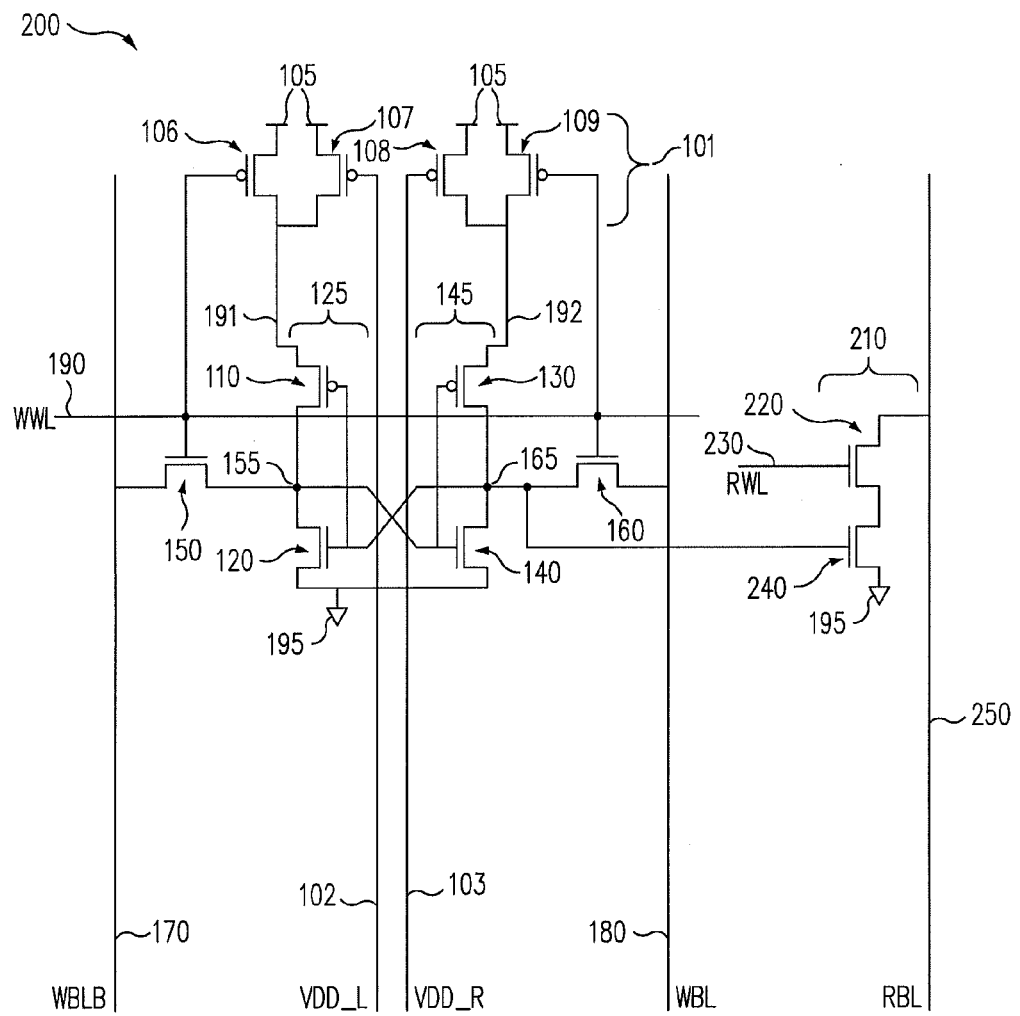

Circuit 100 may be modified to include various read port implementations and other power switch circuit implementations in accordance with other embodiments further discussed herein. In this regard, FIG. 2 illustrates a circuit 200 which may be used to implement an SRAM cell in accordance with another embodiment of the invention. Circuit 200 includes various elements previously discussed in relation to circuit 100 of FIG. 1. Accordingly, such elements may operate during write operations in a manner as previously described herein with regard to FIG. 1. In particular, in circuit 200, word line 190 and bit lines 170 and 180 may be used during write operations performed on circuit 200.

However, for read operations, circuit 200 includes a single ended read port 210. As shown in FIG. 2, read port 210 includes a transistor 220 connected with a read word line 230 and a read bit line 250 (also referred to as a data line). Read port 210 further includes a transistor 240 connected with node 165, reference voltage 195, and transistor 220.

As shown in FIG. 2, the gate of transistor 240 is connected with node 165 of circuit 200. Accordingly, transistor 240 will turn on if node 165 is set to a logic high voltage greater than the threshold voltage of transistor 240. Similarly, transistor 240 will turn off if node 165 is set to a logic low voltage lower than the threshold voltage of transistor 240.

Transistor 220 is connected with read word line 230 and read bit line 250 which can be used to read logic states stored by circuit 200. For example, if read word line 230 is set to a logic high voltage, transistor 220 will turn on. If node 165 is set to a logic high voltage, transistor 240 will also turn on. In this case, the combined operation of transistors 220 and 240 will operate to pull read bit line 250 down to a logic low voltage which may be detected as a logic state by appropriate read circuitry, such as a sense amplifier and voltage keeper circuitry (not shown) connected with read bit line 250. If node 165 is set to a logic low voltage, transistor 240 will turn off. As a result, read bit line 250 will not be pulled down which may be detected as another logic state.

Advantageously, the implementation of read port 210 described above can improve the stability of logic states stored by circuit 200. Specifically, node 165 may operate to switch transistor 240 on and off to selectively pull down read bit line 250 without requiring node 165 to drive current directly to read port 210 during read operations. In this regard, node 165 is not directly connected to read bit line 250 but rather is insulated by transistors 220 and 240. As a result, the static noise margin associated with read operations performed on circuit 200 may be reduced or eliminated. In addition, the lowest voltage of the read port is determined by the dynamic structure of read bit line 250.

Figure 3:
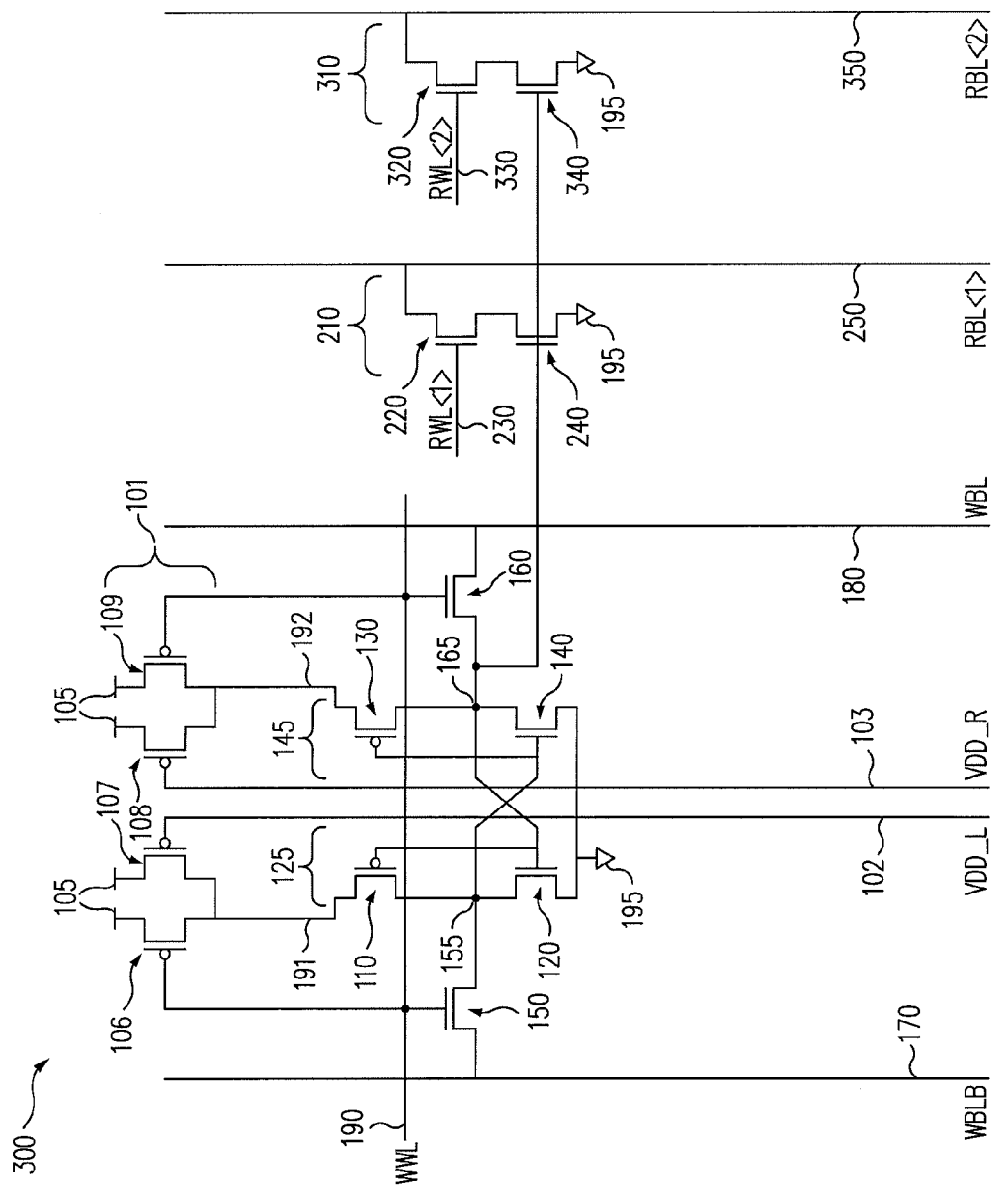

FIG. 3 illustrates a circuit 300 which may be used to implement an SRAM cell in accordance with another embodiment of the invention. Circuit 300 includes various elements previously discussed in relation to circuit 200 of FIG. 2.

Circuit 300 also includes another single ended read port 310 which may be implemented as a second one of read ports 210 previously discussed above. For example, as shown in FIG. 3, read port 310 includes a transistor 330 connected with a read word line 330 and a read bit line 350 (also referred to as a data line). Read port 310 further includes a transistor 340 connected with node 165, reference voltage 195, and transistor 330. The gate of transistor 340 is also connected with node 165 of circuit 300.

Read port 310 may be operated in a similar fashion as previously described above with respect to read port 210. Advantageously, by implementing both of read ports 210 and 310 in circuit 300, the SRAM cell may be selectively read from either or both of read ports 210 and 310 without disturbing the logic states stored by circuit 300. For example, in one embodiment, circuit 300 may be implemented as part of a register file having multiple read ports. Additional read ports may be added to provide a desired number of read ports as may be appropriate in particular implementations, such as multiport register files.

Figure 4:
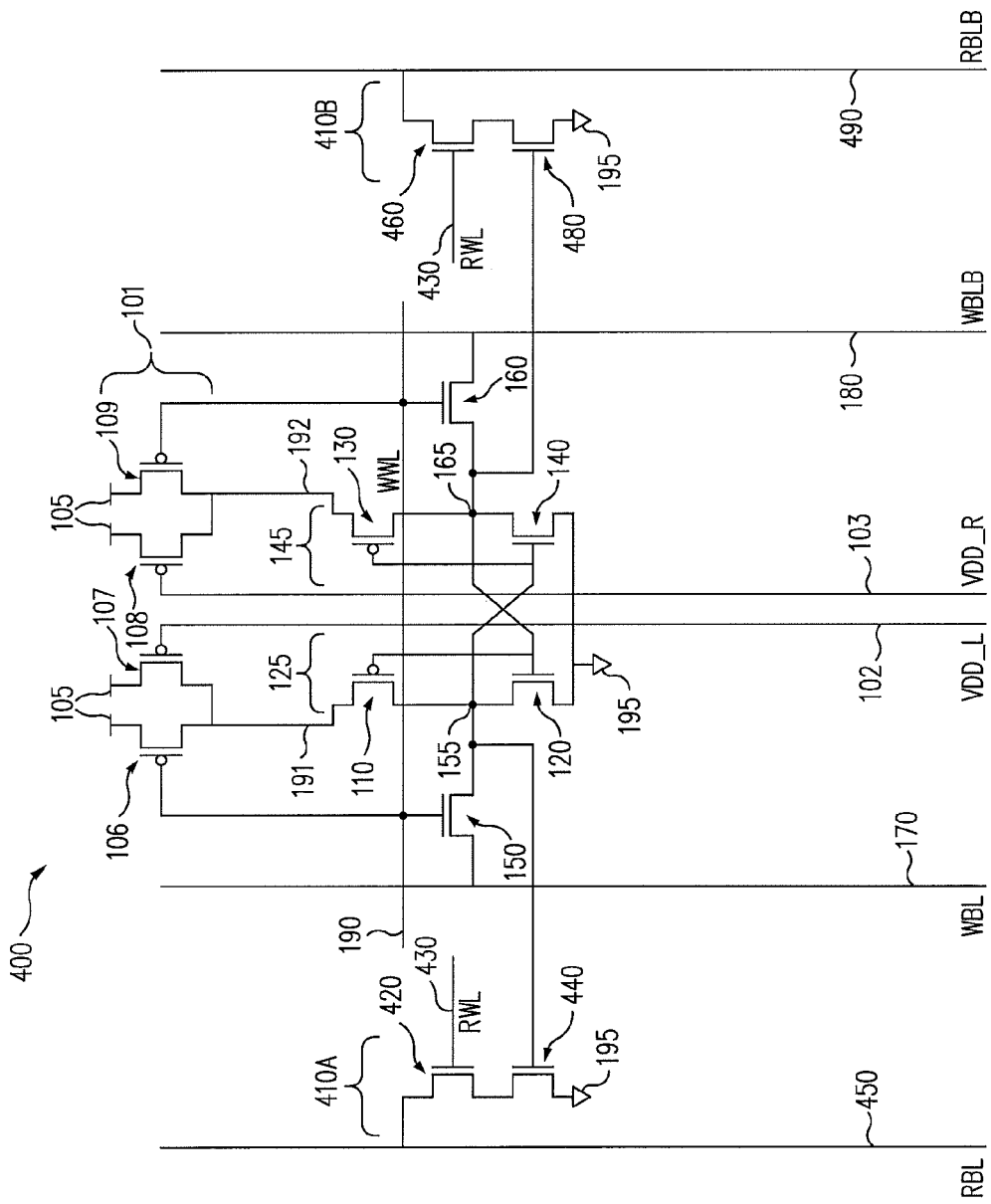

FIG. 4 illustrates a circuit 400 which may be used to implement an SRAM cell in accordance with another embodiment of the invention. Circuit 400 includes various elements previously discussed in relation to circuit 100 of FIG. 1. Accordingly, such elements may operate during write operations in a manner as previously described herein with regard to FIG. 1. In particular, in circuit 400, word line 190 and bit lines 170 and 180 are used during write operations.

However, for read operations, circuit 400 includes a differential read port implemented with portions 410A and 410B. As shown in FIG. 4, the differential read port includes transistors 420 and 460 connected with differential read bit lines 450 and 490 (also referred to as data lines), respectively, and also connected with a read word line 430. The differential read port further includes transistors 440 and 480 connected with nodes 155 and 165, transistors 420 and 460, and reference voltage 195.

Each of portions 410A and 410B of the differential read port may be implemented in a manner as similarly described above with regard to single ended read port 210 of FIG. 2. In this regard, each portion 410A and 410B may be operated in a fashion similar to singled ended read port 210, but with appropriate differential sensing circuitry connected with read bit lines 450 and 490 to detect the logic states stored by circuit 400 depending on which of read bit lines 450 or 490 is pulled low.

Advantageously, the differential read port of FIG. 4 can reduce the time associated with the detection of logic states stored by circuit 400. In addition, because one of read bit lines 450 and 490 will be pulled low during read operations, voltage keeper circuitry need not be connected with read bit lines 450 and 490. In particular, such an implementation does not suffer from leaks associated with dynamic gate keepers.

Moreover, the differential implementation of the read port can facilitate low voltage operation on read bit lines 450 and 490, improved read speed over a single-ended read port implementation, and improved tolerance for common mode noise. For example, in one embodiment, the lowest operational voltage of circuit 400 may be determined primarily by the differential read port and retention voltage. In one embodiment, voltages of approximately 0.25 volts may be used on read bit lines 450 and 490, and a retention voltage of approximately 0.3 volts may be used on nodes 155 and 165. In one embodiment, circuit 400 may be implemented in a memory device configured to support write mask operation using, for example, a read-modified-write implementation.

Figure 5:
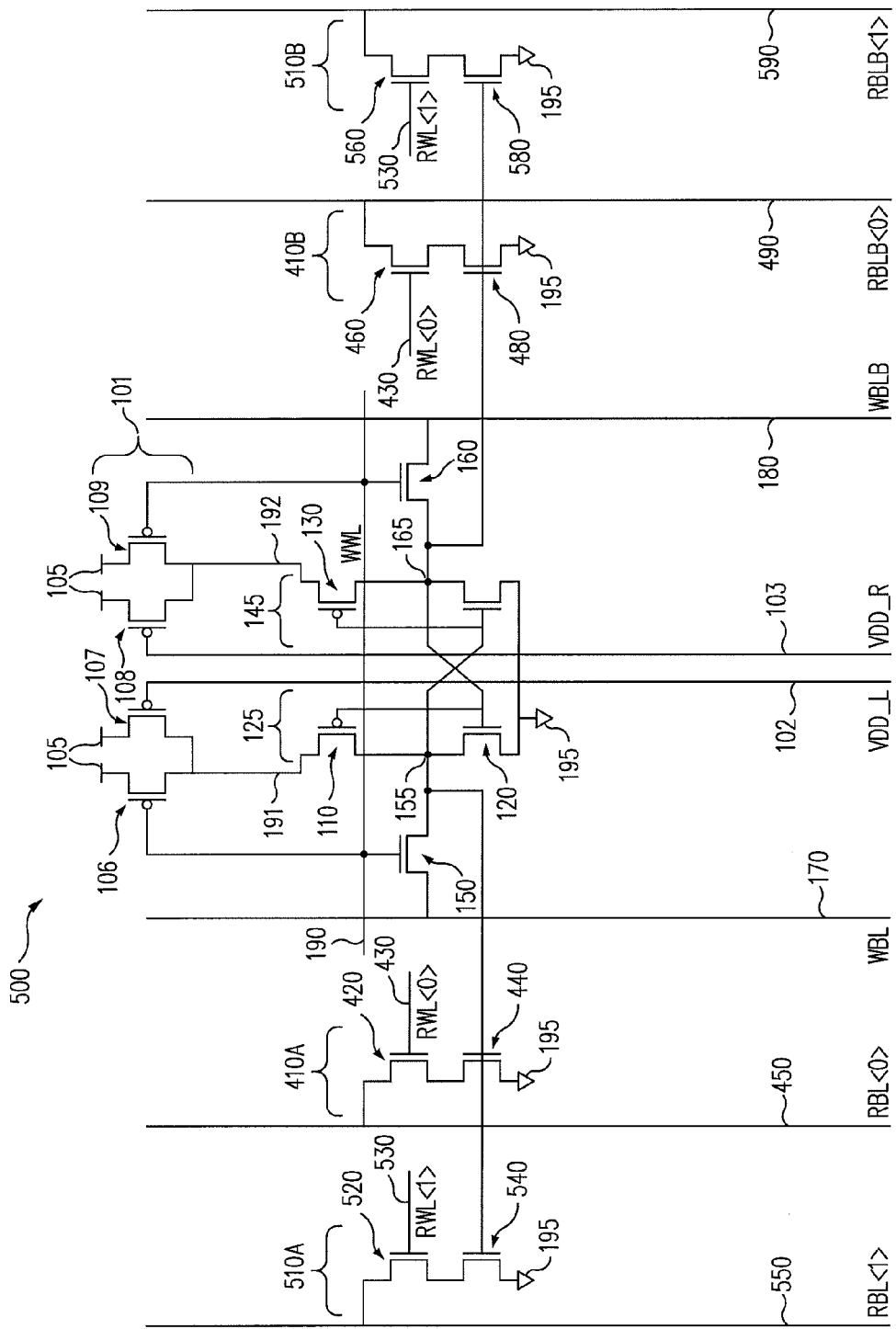

FIG. 5 illustrates a circuit 500 which may be used to implement an SRAM cell in accordance with another embodiment of the invention. Circuit 500 includes various elements previously discussed in relation to circuit 200 of FIG. 4.

Circuit 500 also includes another differential read port implemented with portions 510A and 510B which may be implemented as a second one of the differential read ports previously discussed above in relation to FIG. 4. For example, as shown in FIG. 5, differential read port 510 includes transistors 520 and 560 connected with differential read bit lines 550 and 590 (also referred to as data lines), respectively, and also connected with read word line 530. Differential read port 510 further includes transistors 540 and 580 connected with nodes 155 and 165, transistors 520 and 560, and reference voltage 195.

Differential read port 510 may be operate in a similar fashion as previously described above with respect to the differential read port of FIG. 4. Advantageously, by implementing two differential read ports in circuit 500, the SRAM cell may be selectively read from either or both of the differential read ports. For example, in one embodiment, circuit 500 may be implemented as part of a register file having multiple read ports. Additional differential or single ended read ports may be added to provide a desired number of read ports as may be appropriate in particular implementations, such as multiport register files.

Figure 6:
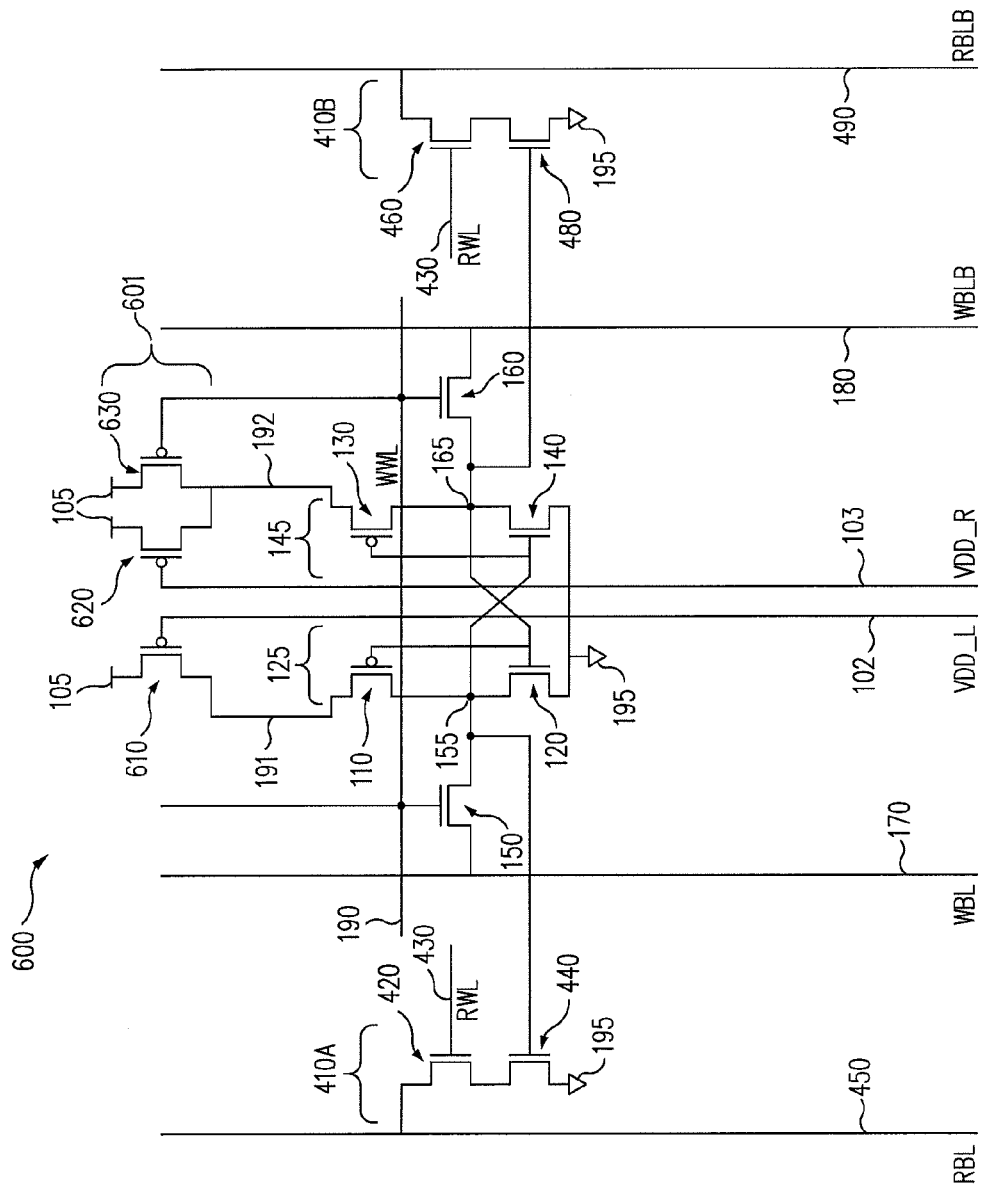

FIG. 6 illustrates a circuit 600 which may be used to implement an SRAM cell in accordance with another embodiment of the invention. Circuit 600 includes various elements previously discussed in relation to circuit 400 of FIG. 4. Accordingly, such elements may operate in a manner as previously described herein.

However, circuit 600 includes an alternate power switch circuit 601 in place of power switch circuit 101. Power switch circuit 601 includes transistors 610, 620, and 630, each of which are connected with reference voltage 105. The gates of transistors 610 and 620 are connected with power control lines 102 and 103, respectively, which may be used to selectively turn on or turn off transistors 610 and 620. The gate of transistor 630 is connected with word line 190 which may be used to selectively turn on or turn off transistor 630.

During read operations, power control lines 102 and 103 and word line 190 may be set to logic low voltages. As a result, transistors 610, 620, and 630 remain turned on to power transistors 110/120 and 130/140 of circuit 600.

During write operations, power control lines 102 and 103 may be used to selectively turn off transistor 610 or 620, and word line 190 may be used to turn off transistor 630. For example, while bit line 170 is set to a logic low voltage to write a desired logic state into circuit 600, power control line 102 may be set to a logic high voltage, power control line 103 may be set to a logic low voltage, and word line 190 may be set to a logic high voltage. In this case, transistor 620 will remain turned on and transistors 610 and 630 will turn off. As a result, power supply line 191 will be permitted to float and will enable writing into the SRAM cell with a lower minimum voltage.

To write a logic high state into circuit 600, power control line 102 may be set to a logic low voltage, power control line 103 may be set to a logic high voltage, and word line 190 may be set to a logic high voltage. In this case, transistors 620 and 630 will turn off and transistor 610 will remain turned on. As a result, power supply line 192 will be permitted to float and to also enable writing into the SRAM cell with a lower minimum voltage.

Power switch circuit 601 may be used to provide the advantages of power switch circuit 101 previously described above, with one fewer transistor. For example, transistors 610 and 620 may remain turned on during read operations in order to provide power to transistors 110/120 and 130/140 and maintain the logic state stored by circuit 600. In addition, transistors 610, 620, and 630 may be selectively switched on and off during write operations performed on circuit 600 to facilitate the writing of desired logic states into circuit 600. Also, transistor 630 will remain turned on when word line 190 is set to a logical low voltage, regardless of the logic signals provided to power control lines 102 and 103. As a result, transistor 630 may continue to maintain the logic state stored by circuit 600 during read or write operations performed on other SRAM cells sharing a column (and also sharing power control lines 102 and 103) with circuit 600.

Figure 7:
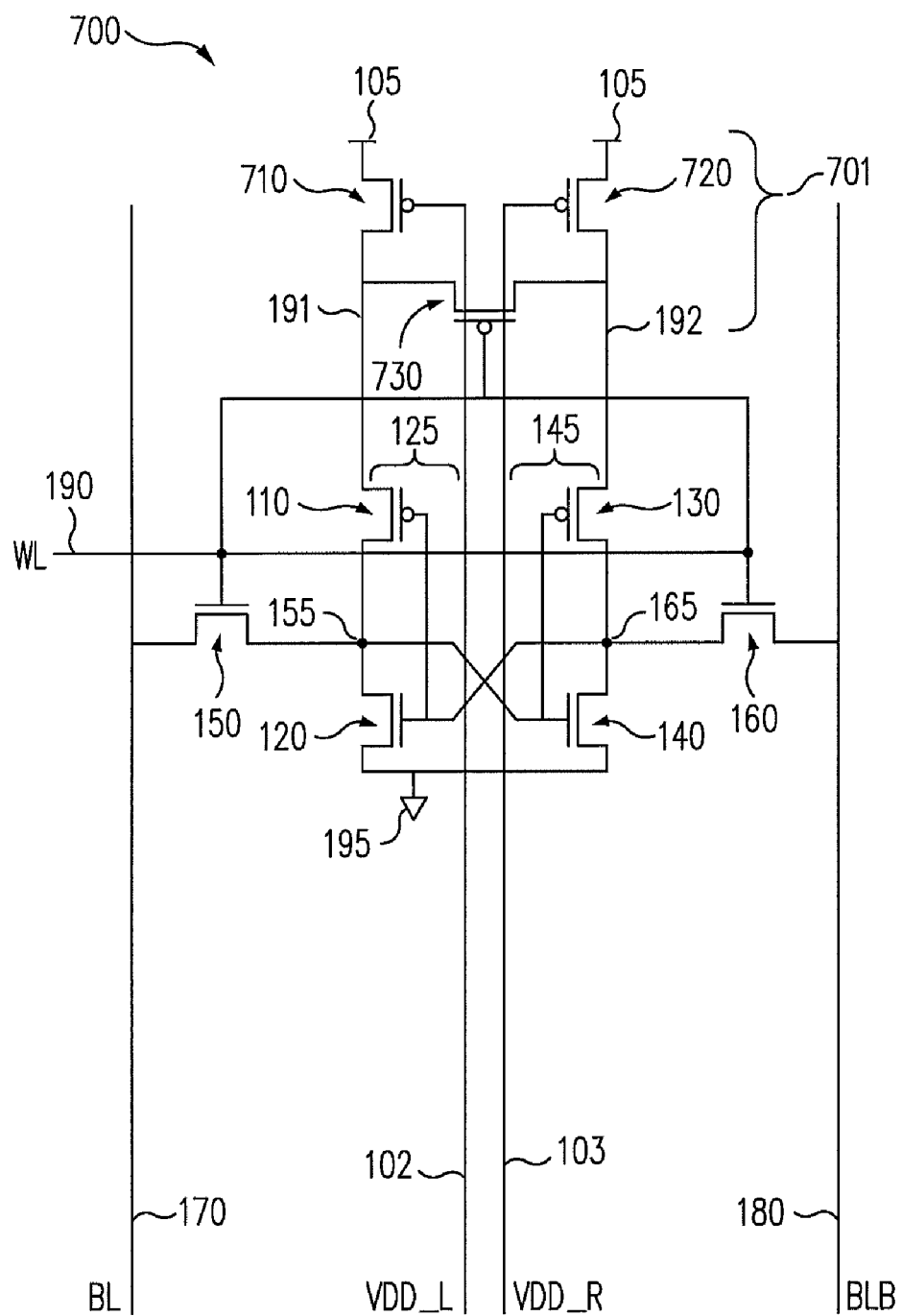

FIG. 7 illustrates a circuit 700 which may be used to implement an SRAM cell in accordance with another embodiment of the invention. Circuit 700 includes various elements previously discussed in relation to circuit 100 of FIG. 1. Accordingly, such elements may operate in a manner as previously described herein with regard to FIG. 1.

However, circuit 700 includes an alternate power switch circuit 701 in place of power switch circuit 101. Power switch circuit 701 includes transistors 710, 720, and 730. As shown, transistors 710 and 720 are connected with reference voltage 105. The gates of transistors 710 and 720 are connected with power control lines 102 and 103, respectively. In this regard, it will be further appreciated that power control lines 102 and 103 may be used to selectively turn on or turn off transistors 710 and 720. Transistor 730 is connected with transistors 710 and 720, and the gate of transistor 730 is connected with word line 190. Accordingly, transistor 730 may be turned on and off in response to word line 190.

During read operations, power control lines 102 and 103 may be set to logic low voltages. As a result, transistors 710 and 720 remain turned on to power transistors 110/120 and 130/140 of circuit 700.

During a write operation to switch circuit 700 from a first logic state to a second logic state (e.g., corresponding to setting node 155 to a logic high voltage and setting node 165 to a logic low voltage), power control lines 102 and 103 may be set to logic low and logic high voltages to turn on and turn off transistors 710 and 720, respectively. Word line 190 will also be set to a logic high voltage which causes transistor 730 to turn off. As a result, as similarly described with respect to circuit 100 of FIG. 1, power switch circuit 701 may interrupt power provided through power supply line 192 while continuing to provide power through power supply line 191.

Similarly, when switching circuit 700 from the second logic state to the first logic state, power control lines 102 and 103 may be set to logic high and logic low voltages to turn off and turn on transistors 710 and 720, respectively. Accordingly, power switch circuit 701 may interrupt power provided through power supply line 191 while continuing to provide power through power supply line 192.

As previously described with respect to FIG. 1, power control lines 102 and 103 may be shared by a column of SRAM cells in an SRAM cell array implemented by a plurality of circuits 700. Because of this shared implementation, either transistor 710 or 720 of all SRAM cells in a column will be switched off during write operations performed on any one of the rows of SRAM cell array. However, during a write operation performed on one row, the word lines 190 associated with the remaining rows of the SRAM cell array will be set to logic low voltages. As a result, the transistors 730 of the non-writing rows will remain turned on, while the transistor 730 of the currently written row will be turned off. As a result, for those rows that are not currently being written, transistor 730 may operate to power transistors 110 and 120 (if transistor 710 is turned off by power control signal 102) or to power transistors 130 and 140 (if transistor 720 is turned off by power control signal 103).

Figure 8:
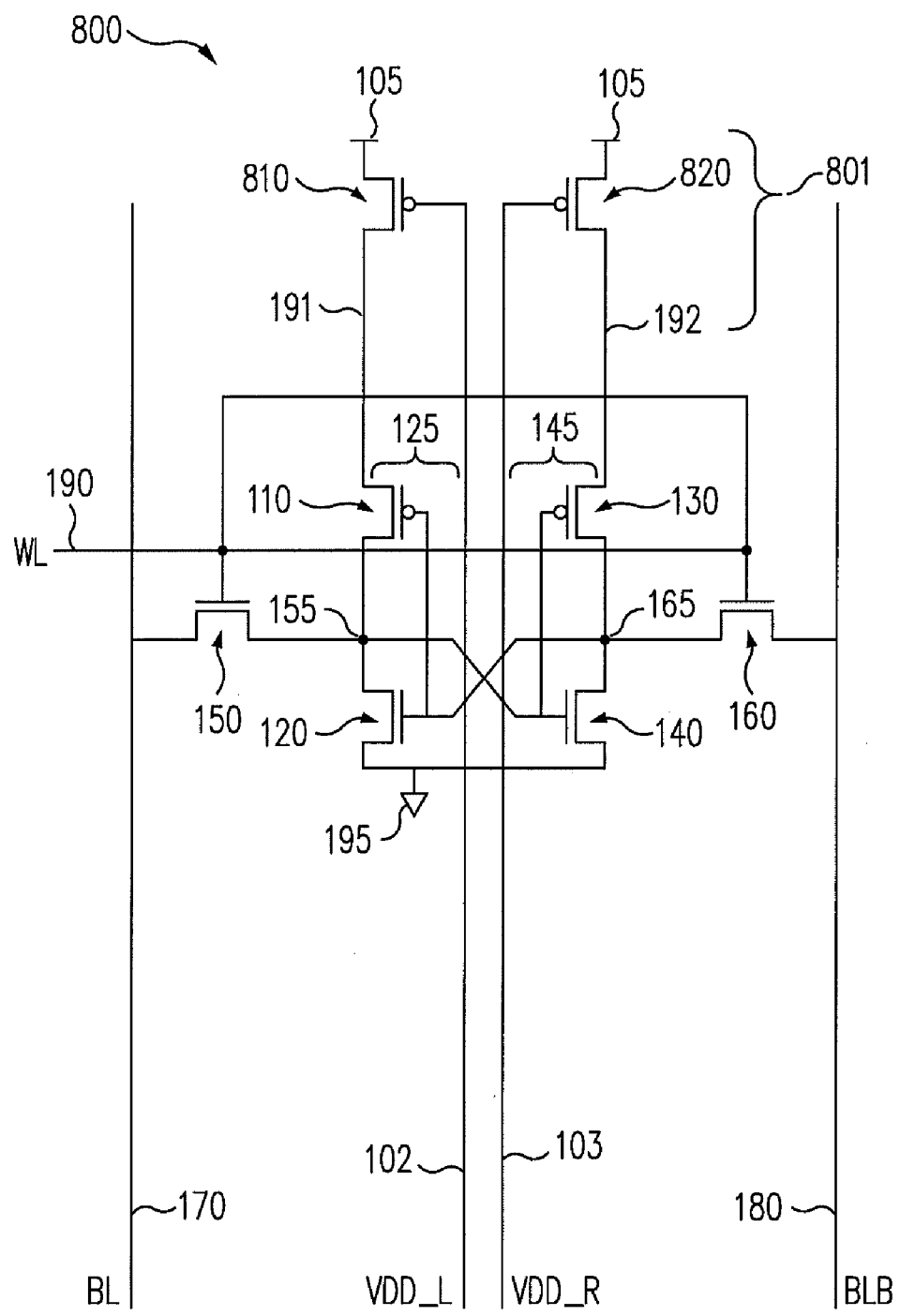

FIG. 8 illustrates a circuit 800 which may be used to implement an SRAM cell in accordance with another embodiment of the invention. Circuit 800 includes various elements previously discussed in relation to circuit 100 of FIG. 1. Accordingly, such elements may operate in a manner as previously described herein with regard to FIG. 1.

However, circuit 800 includes an alternate power switch circuit 801 in place of power switch circuit 101. Power switch circuit 801 includes transistors 810 and 820. As shown, transistors 810 and 820 are connected with reference voltage 105. The gates of transistors 810 and 820 are connected with power control lines 102 and 103, respectively. In this regard, it will be further appreciated that power control lines 102 and 103 may be used to selectively turn on or turn off transistors 810 and 820.

During read operations, power control lines 102 and 103 may be set to logic low voltages. As a result, transistors 810 and 820 remain turned on to power transistors 110/120 and 130/140 of circuit 800.

During a write operation to switch circuit 800 from a first logic state to a second logic state (e.g., corresponding to setting node 155 to a logic high voltage and setting node 165 to a logic low voltage), power control lines 102 and 103 may be set to logic low and logic high voltages to turn on and turn off transistors 810 and 820, respectively. As a result, as similarly described with respect to circuit 100 of FIG. 1, power switch circuit 801 will interrupt power provided through power supply line 192 while continuing to provide power through power supply line 191.

Similarly, when switching circuit 800 from the second logic state to the first logic state, power control lines 102 and 103 may be set to logic high and logic low voltages to turn off and turn on transistors 810 and 820, respectively. Accordingly, power switch circuit 801 will interrupt power provided through power supply line 191 while continuing to provide power through power supply line 192.

Accordingly, by selectively interrupting the power provided to power supply line 191 or 192 during write operations, desired logic states may be more easily written into the SRAM cell of circuit 800 when implemented with low operating voltages.

Although various SRAM circuit embodiments have been disclosed, various aspects of such embodiments may be combined as desired in particular implementations. For example, it is contemplated that any of the power switch circuits and/or ports described herein may be combined in additional embodiments where appropriate.

Embodiments incorporating various features disclosed herein may be implemented in embedded or standalone SRAM memory devices, caches, register files, multi-port memories, translation lookaside buffers (TLBS), content-addressable memories (CAMS), ternary CAMS (TCAMS), or other appropriate devices to operate at lower voltages as compared to traditional six transistor SRAM cells. Such features can be particularly advantageous for mobile, portable, or ultra-low voltage devices in which lower supply voltages may advantageously permit longer battery life and/or use time.

Figure 9:
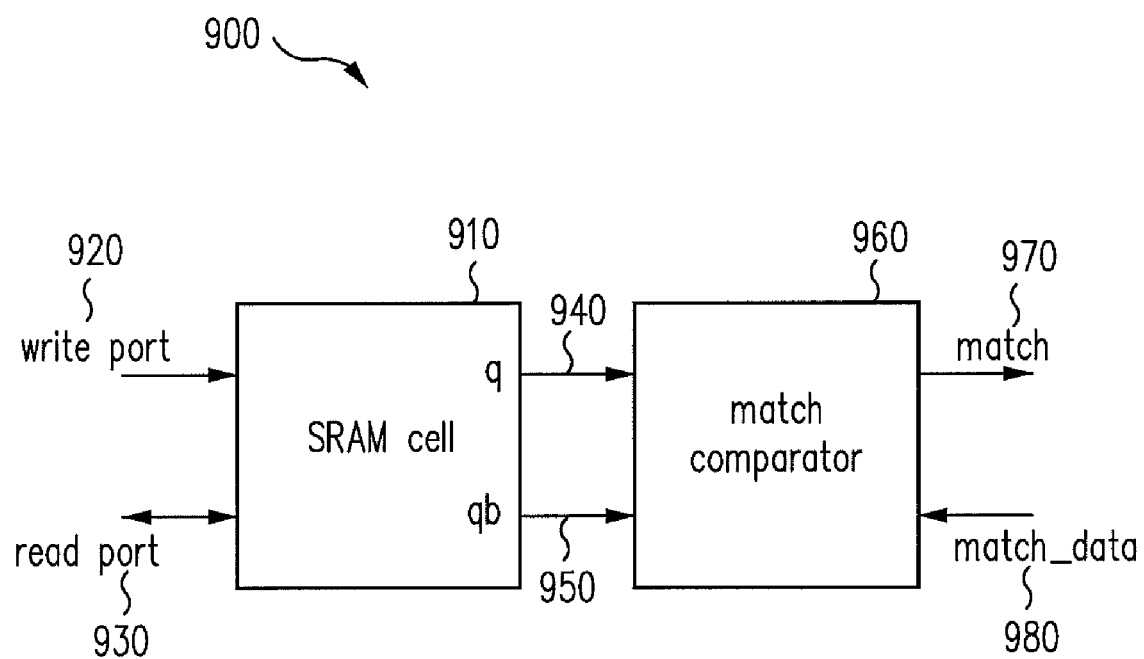
FIG. 9 illustrates an example of a memory device including an SRAM cell in accordance with an embodiment of the invention.

For example, FIG. 9 illustrates an example of a memory device that may be implemented with one or more of the various SRAM cell circuits disclosed herein. In this regard, illustrates a CAM memory device 900 including an SRAM cell 910 and a match comparator 960 in block form. As shown, SRAM cell 910 includes a write port 920 and a read port 930, each of which may be implemented in accordance with one or more of the various circuits described herein.

Logic states stored by SRAM cell 910 are provided to match comparator 960 over complementary data output lines 940 and 950 which may, for example, be connected with nodes 155 and 160, respectively of the various circuits described herein. Match comparator 960 may be implemented with appropriate circuitry known in the art to compare a data value received at an input port 980 (labeled "match_data") with logic states received from data output line 940 and/or 950. Match comparator 960 may then provide an appropriate data signal through output port 970 (labeled "match" to indicate the existence of a match or non-match between the data value received at input port 980 and the logic state stored by SRAM cell 910. Other implementations and applications of SRAM cell circuits in accordance with various embodiments described herein are also contemplated.

The hardware described above, including any logic or transistor circuit, may be generated automatically by computer based on a description of the hardware expressed in the syntax and the semantics of a hardware description language, as known by those skilled in the art. Applicable hardware description languages include those provided at the layout, circuit netlist, register transfer, and schematic capture levels. Examples of hardware description languages include GDS II and OASIS (layout level), various SPICE languages and IBIS (circuit netlist level), Verilog and VHDL (register transfer level) and Virtuoso custom design language and Design Architecture-IC custom design language (schematic capture level). The hardware description may also be used, for example, in various behavior, logic and circuit modeling and simulation purposes.

The foregoing disclosure is not intended to limit the invention to the precise forms or particular fields of use disclosed. It is contemplated that various alternate embodiments and/or modifications to the invention, whether explicitly described or implied herein, are possible in light of the disclosure.

Having thus described embodiments of the invention, persons of ordinary skill in the art will recognize that changes may be made in form and detail without departing from the scope of the invention. Thus the invention is limited only by the claims.

What is claimed is:

1. A memory device comprising:
a first word line; and
a first static random access memory (SRAM) cell comprising:
first and second cross-coupled logic gates adapted to maintain voltages at a first node and a second node, wherein the voltages of the first and second nodes correspond to a logic state stored by the first and second cross-coupled logic gates, and
a first power switch circuit comprising:
a first switch connected with a power source and the first cross-coupled logic gate, the first switch is adapted to selectively connect the power source with the first cross-coupled logic gate in response to a first logic signal,
a second switch connected with the power source and the second cross-coupled logic gate, the second switch is adapted to selectively connect the power source with the second cross-coupled logic gate in response to a second logic signal, and
a third switch connected with the power source and the first cross-coupled logic gate, the third switch is adapted to selectively connect the power source with the first cross-coupled logic gate in response to a third logic signal applied to the first word line.

2. The memory device of claim 1, the first power switch circuit further comprising a third switch connected with the power source and the second cross-coupled logic gate, the fourth switch is adapted to selectively connect the power source with the second cross-coupled logic gate in response to a third logic signal applied to the first word line.

3. The memory device of claim 1, further comprising:
a second word line; and
a second SRAM cell comprising:
third and fourth cross-coupled logic gates adapted to maintain voltages at a third node and a fourth node, wherein the voltages of the third and fourth nodes correspond to a logic state stored by the third and fourth cross-coupled logic gates, and
a second power switch circuit comprising:
a third switch connected with a power source and the third cross-coupled logic gate, the third switch is adapted to selectively connect the power source with the third cross-coupled logic gate in response to the first logic signal, and
a fourth switch connected with the power source and the fourth cross-coupled logic gate, the fourth switch is adapted to selectively connect the power source with the fourth cross-coupled logic gate in response to the second logic signal.

4. The memory device of claim 1, the first power switch circuit further comprising a third switch connected with the first switch, the second switch, the first cross-coupled logic gate, the second cross-coupled logic gate, and the first word line, the third switch is adapted to selectively connect the first switch with the second cross-coupled logic gate or the second switch with the first cross-coupled logic gate in response to a third logic signal applied to the first word line.

5. The memory device of claim 4, further comprising:
a second word line; and
a second SRAM cell comprising:
third and fourth cross-coupled logic gates adapted to maintain voltages at a third node and a fourth node, wherein the voltages of the third and fourth nodes correspond to a logic state stored by the third and fourth cross-coupled logic gates, and
a second power switch circuit comprising:
a third switch connected with a power source and the third cross-coupled logic gate, the third switch is adapted to selectively connect the power source with the third cross-coupled logic gate in response to the first logic signal, and
a fourth switch connected with the power source and the fourth cross-coupled logic gate, the fourth switch is adapted to selectively connect the power source with the fourth cross-coupled logic gate in response to the second logic signal.

6. The memory device of claim 1, further comprising:
a first data line;
a second word line; and
the first SRAM cell further comprising a first single ended read port comprising:
a third switch connected with the first data line and the second word line, and
a fourth switch connected with the first node, the third switch, and a reference voltage, the fourth switch is adapted to selectively connect the third switch with the reference voltage in response to the voltage of the first node, the third switch is adapted to selectively connect the first data line with the fourth switch in response to a third logic signal applied to the second word line.

7. The memory device of claim 6, further comprising:
a second data line;
a third word line; and
the first SRAM cell further comprising a second single ended read port comprising:
a fifth switch connected with the second data line and the third word line, and
a sixth switch connected with the second node, the fifth switch, and the reference voltage, the sixth switch is adapted to selectively connect the fifth switch with the reference voltage in response to the voltage of the second node, the fifth switch is adapted to selectively connect the second data line with the sixth switch in response to a fourth logic signal applied to the third word line.

8. The memory device of claim 1, further comprising:
a first data line;
a second data line;
a second word line; and
the first SRAM cell further comprising a first differential read port comprising:
a third switch connected with the first data line and the second word line,
a fourth switch connected with the first node, the third switch, and a reference voltage, the fourth switch is adapted to selectively connect the third switch with the reference voltage in response to the voltage of the first node, the third switch is adapted to selectively connect the first data line with the fourth switch in response to a third logic signal applied to the second word line,
a fifth switch connected with the second data line and the second word line, and
a sixth switch connected with the second node, the fifth switch, and the reference voltage, the sixth switch is adapted to selectively connect the fifth switch with the reference voltage in response to the voltage of the second node, the fifth switch is adapted to selectively connect the second data line with the sixth switch in response to the third logic signal applied to the second word line.

9. The memory device of claim 8, further comprising:
a third data line;
a fourth data line;
a third word line; and
the first SRAM cell further comprising a second differential read port comprising:
   a seventh switch connected with the third data line and the third word line,
   a eighth switch connected with the first node, the seventh switch, and the reference voltage, the eighth switch is adapted to selectively connect the seventh switch with the reference voltage in response to the voltage of the first node, the seventh switch is adapted to selectively connect the third data line with the eighth switch in response to a fourth logic signal applied to the third word line,
   a ninth switch connected with the fourth data line and the third word line, and
   a tenth switch connected with the second node, the ninth switch, and the reference voltage, the tenth switch is adapted to selectively connect the ninth switch with the reference voltage in response to the voltage of the second node, the ninth switch is adapted to selectively connect the fourth data line with the tenth switch in response to the fourth logic signal applied to the third word line.

10. The memory device of claim 1, wherein the switches are transistors.

11. The memory device of claim 1, wherein the memory device is selected from the group consisting of: an embedded SRAM memory device, a standalone SRAM memory device, a cache, a register file, a multi-port memory, a translation lookaside buffer, a content addressable memory, and a ternary content-addressable memory.

12. A static random access memory (SRAM) cell comprising:
   means for storing a logic state;
   means for selectively providing power to a first portion of the storing means in response to a first logic signal; and
   means for selectively providing power to a second portion of the storing means in response to a second logic signal,
   wherein the first providing means comprises means for providing power to the first portion of the storing means during a read operation performed on the SRAM cell, interrupting power to the first portion of the storing means during a first write operation performed on the SRAM cell, and maintaining power to the first portion of the storing means during a second write operation performed on the SRAM cell, and
   wherein the second providing means comprises means for providing power to the second portion of the storing means during the read, interrupting power to the second portion of the storing means during the first write operation, and maintaining power to the second portion of the storing means during the second write operation.

13. The SRAM cell of claim 12, wherein the first providing means is further responsive to a third logic signal received over a word line connected with the SRAM cell.

14. The SRAM cell of claim 13, wherein the second providing means is further responsive to the third logic signal.

15. A computer-readable medium that includes a circuit description of a memory device, wherein the circuit description, when interpreted by a computer, specifies the memory device comprising:
   a first word line; and
   a first static random access memory (SRAM) cell comprising:
      first and second cross-coupled logic gates adapted to maintain voltages at a first node and a second node, wherein the voltages of the first and second nodes correspond to a logic state stored by the first and second cross-coupled logic gates, and
      a first power switch circuit comprising:
         a first switch connected with a power source and the first cross-coupled logic gate, the first switch is adapted to selectively connect the power source with the first cross-coupled logic gate in response to a first logic signal,
         a second switch connected with the power source and the second cross-coupled logic gate, the second switch is adapted to selectively connect the power source with the second cross-coupled logic gate in response to a second logic signal, and
         a third switch connected with a power source and the first cross-coupled logic gate, the third switch is adapted to selectively connect the power source with the first cross-coupled logic gate in response to a third logic signal applied to the first word line.

16. The computer-readable medium of claim 15, the first power switch circuit further comprising a fourth switch connected with the power source and the second cross-coupled logic gate, the fourth switch is adapted to selectively connect the power source with the second cross-coupled logic gate in response to the third logic signal applied to the first word line.

17. The computer-readable medium of claim 15, the memory device further comprising:
   a second word line; and
   a second SRAM cell comprising:
      third and fourth cross-coupled logic gates adapted to maintain voltages at a third node and a fourth node, wherein the voltages of the third and fourth nodes correspond to a logic state stored by the third and fourth cross-coupled logic gates, and
      a second power switch circuit comprising:
         a third switch connected with a power source and the third cross-coupled logic gate, the third switch is adapted to selectively connect the power source with the third cross-coupled logic gate in response to the first logic signal, and
         a fourth switch connected with the power source and the fourth cross-coupled logic gate, the fourth switch is adapted to selectively connect the power source with the fourth cross-coupled logic gate in response to the second logic signal.

18. The computer-readable medium of claim 15, the first power switch circuit further comprising a third switch connected with the first switch, the second switch, the first cross-coupled logic gate, the second cross-coupled logic gate, and the first word line, the third switch is adapted to selectively connect the first switch with the second cross-coupled logic gate or the second switch with the first cross-coupled logic gate in response to a third logic signal applied to the first word line.

19. The computer-readable medium of claim 18, the memory device further comprising:
   a second word line; and
   a second SRAM cell comprising:
      third and fourth cross-coupled logic gates adapted to maintain voltages at a third node and a fourth node, wherein the voltages of the third and fourth nodes correspond to a logic state stored by the third and fourth cross-coupled logic gates, and a second power switch circuit comprising:

a third switch connected with a power source and the third cross-coupled logic gate, the third switch is adapted to selectively connect the power source with the third cross-coupled logic gate in response to the first logic signal, an a fourth switch connected with the power source and the fourth cross-coupled logic gate, the fourth switch is adapted to selectively connect the power source with the fourth cross-coupled logic gate in response to the second logic signal.

20. The computer-readable medium of claim 15, the memory device further comprising:

a first data line;

a second word line; and the first SRAM cell further comprising a first single ended read port comprising:

a third switch connected with the first data line and the second word line, and a fourth switch connected with the first node, the third switch, and a reference voltage, the fourth switch is adapted to selectively connect the third switch with the reference voltage in response to the voltage of the first node, the third switch is adapted to selectively connect the first data line with the fourth switch in response to a third logic signal applied to the second word line.

21. The computer-readable medium of claim 20, the memory device further comprising:

a second data line;

a third word line; and the first SRAM cell further comprising a second single ended read port comprising:

a fifth switch connected with the second data line and the third word line, and a sixth switch connected with the second node, the fifth switch, and the reference voltage, the sixth switch is adapted to selectively connect the fifth switch with the reference voltage in response to the voltage of the second node, the fifth switch is adapted to selectively connect the second data line with the sixth switch in response to a fourth logic signal applied to the third word line.

22. The computer-readable medium of claim 15, the memory device further comprising:

a first data line;

a second data line;

a second word line; and the first SRAM cell further comprising a first differential read port comprising:

a third switch connected with the first data line and the second word line, a fourth switch connected with the first node, the third switch, and a reference voltage, the fourth switch is adapted to selectively connect the third switch with the reference voltage in response to the voltage of the first node, the third switch is adapted to selectively connect the first data line with the fourth switch in response to a third logic signal applied to the second word line, a fifth switch connected with the second data line and the second word line, and a sixth switch connected with the second node, the fifth switch, and the reference voltage, the sixth switch is adapted to selectively connect the fifth switch with the reference voltage in response to the voltage of the second node, the fifth switch is adapted to selectively connect the second data line with the sixth switch in response to the third logic signal applied to the second word line.

23. The computer-readable medium of claim 22, the memory device further comprising:

a third data line;

a fourth data line;

a third word line; and the first SRAM cell further comprising a second differential read port comprising:

a seventh switch connected with the third data line and the third word line, a eighth switch connected with the first node, the seventh switch, and the reference voltage, the eighth switch is adapted to selectively connect the seventh switch with the reference voltage in response to the voltage of the first node, the seventh switch is adapted to selectively connect the third data line with the eighth switch in response to a fourth logic signal applied to the third word line, a ninth switch connected with the fourth data line and the third word line, and a tenth switch connected with the second node, the ninth switch, and the reference voltage, the tenth switch is adapted to selectively connect the ninth switch with the reference voltage in response to the voltage of the second node, the ninth switch is adapted to selectively connect the fourth data line with the tenth switch in response to the fourth logic signal applied to the third word line.

24. The computer-readable medium of claim 15, wherein the switches are transistors.

25. The computer-readable medium of claim 15, wherein the memory device is selected from the group consisting of: an embedded SRAM memory device, a standalone SRAM memory device, a cache, a register file, a multi-port memory, a translation lookaside buffer, a content-addressable memory, and a ternary content-addressable memory.

* * * * *

UNITED STATES PATENT AND TRADEMARK OFFICE
CERTIFICATE OF CORRECTION

| | |
|---|---|
| PATENT NO. | : 7,570,537 B2 |
| APPLICATION NO. | : 11/777074 |
| DATED | : August 4, 2009 |
| INVENTOR(S) | : Ajay Bhatia |

Page 1 of 1

It is certified that error appears in the above-identified patent and that said Letters Patent is hereby corrected as shown below:

In Claim 2, Column 11 (line 31), please replace "third" with --fourth--.

In Claim 19, Column 15 (line 8), please replace "an" with --and--.

Signed and Sealed this

Twenty-second Day of September, 2009

David J. Kappos
*Director of the United States Patent and Trademark Office*